United States Patent [19]

Leung

[11] Patent Number: 5,242,310
[45] Date of Patent: Sep. 7, 1993

[54] PC I/O CARD

[75] Inventor: Tommy Y. Leung, Cassopolis, Mich.

[73] Assignee: Data Trek Corporation, Elkhart, Ind.

[21] Appl. No.: 901,270

[22] Filed: Jun. 19, 1992

[51] Int. Cl.⁵ .............................................. H05K 5/00
[52] U.S. Cl. .................... 439/76; 235/492; 361/737
[58] Field of Search ...................... 439/68, 76, 79, 80; 361/392, 395, 399, 394; 235/492

[56] References Cited

U.S. PATENT DOCUMENTS

| 4,138,711 | 2/1979 | Bremenour et al. | 361/399 |
| 4,226,491 | 10/1980 | Kazama et al. | 439/76 |
| 5,038,250 | 8/1991 | Uenaka et al. | 235/492 |
| 5,061,845 | 10/1991 | Pinnavaia | 361/399 |

Primary Examiner—Neil Abrams
Attorney, Agent, or Firm—Thomas J. Dodd

[57] ABSTRACT

An I/O card for use in a computer or electrical device having a circuit board encased by a two piece frame and having a connector block securely mounted to the circuit board by the engagement of a pintle in the connector block and a notch in the circuit board.

7 Claims, 2 Drawing Sheets

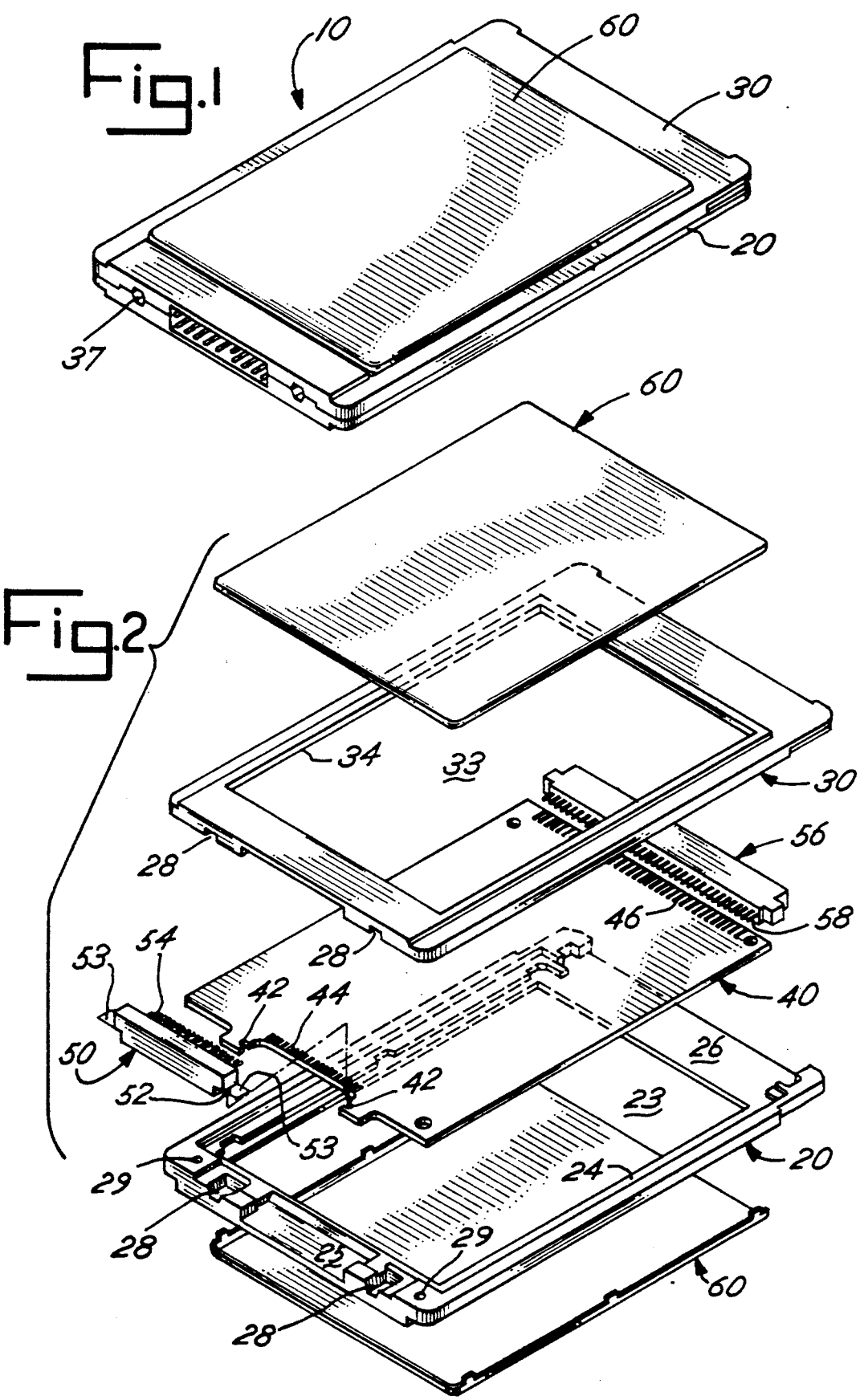

PC I/O CARD

This invention relates to an Input/Output (I/O) Card and will have special application in personal computers (PC) and electronic devices.

SUMMARY OF INVENTION

With the development of lap top and notebook computers and the demand that they be readily connected to a variety of existing peripheral devices and systems, space and utility increasingly has become a critical design factor in I/O devices. Conventionally, I/O devices such as memory boards, modem/fax boards and network communication boards, connect to the computer circuit board through a number of expansion slots. The increased sophistication of computer applications has demanded an increase in available expansion slots, but, at the same time, space available for expansion slot has decreased. I/O cards have emerged to resolve the space demand problems while providing the same functional options.

I/O cards provide all the functional options and flexibility as conventional I/O boards but are contained in a thin compact units. I/O cards address the PC through special connective slots. The use of the card/slot design allows the cards to be removed readily to allow each slot in a computer to meet a variety of user needs. Since the I/O cards are readily removable and often used in lap tops and notebooks, the I/O cards require a durable protected construction.

Structurally, the conventional I/O card has the small circuit board held inside a unitary plastic frame by small screws. To accommodate the various chips and electrical components on the circuit board, a raised cover plate is attached to the frame to cover the circuit board. The circuit board namely has one or more connector blocks for communication with a computer and/or other electrical devices secured to it. The connector blocks are secured to the circuit board by the solder connections between the connector block leads and the tracts on the circuit board. The solder connections provide the only connections between the connector blocks and circuit board. Because I/O cards are readily removable, the solder connections are under significant stress and subject to failure.

This invention provides a structurally stronger I/O card by using a two piece frame bonded together around the circuit board. This invention also provides an improved attachment between the connector blocks and the circuit board by the circuit board having notches which engage pins on the connector blocks. The connector block includes metal brackets which are soldered directly to the circuit board for additional strength. This improved attachment adds to the longevity of the card upon its repeated use.

Accordingly, it is an object of this invention to provide for a novel I/O card.

Another object of this invention is to provide an I/O card with a two piece frame for encasing a circuit board.

Another object of this invention is to provide an I/O card with a connector block securely mounted to the circuit board by engagement of a pin and tab.

Other objects of this invention will become apparent upon a reading of the following description taken with the accompanying drawings.

BRIEF DESCRIPTION OF THE DRAWINGS

FIG. 1 is a perspective view of the assembled I/O card.

FIG. 2 is an exploded view of the I/O card showing the covers, upper and lower frames, circuit board and connectors in separated form.

DESCRIPTION OF THE PREFERRED EMBODIMENT

The preferred embodiment herein described is not intended to be exhaustive or to limit the invention to the precise form disclosed. It is chosen and described to illustrate the principles of the invention and its application and practical use to allow others skilled in the art to follow its teachings.

I/O card 10 includes a circuit board 40. The electrical circuitry and components carried on circuit board 40 will vary with the types of I/O cards.

Figure 3:
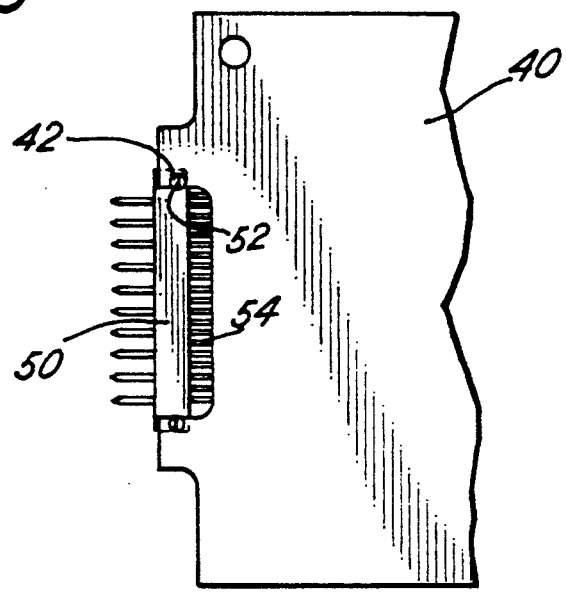
FIG. 3 is a fragmentary bottom plan view of the circuit board and the male connector shown assembled.
Figure 4:
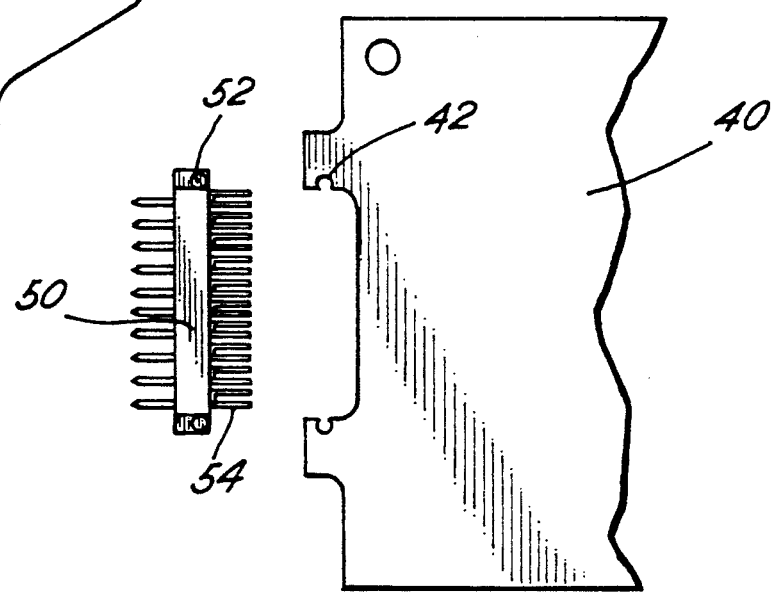
FIG. 4 is a fragmentary bottom plan view of the circuit board and the male connector shown in separated form.

In this embodiment, as shown in FIG. 2, circuit board 40 has two connector blocks 50 and 56. Connector blocks 50 and 56 can have a variety of configurations, pin types, and pin numbers depending on the desired application. As shown in FIGS. 2-4, connector block 50 is a male type connection. Connector block 50 includes two integral molded pins 52 and is mounted to circuit board 40 by having pins 52 fitted inside two notches 42 in circuit board 40. Connector 50 also includes brackets 53 which are soldered to circuit board 40. The use of brackets 53, pintles 52 and notches 42 provide a strong reinforced attachment between connector 50 and circuit board 40. With connector 50 attached to circuit board 40, leads 54 of connector 50 are soldered to tracts 44 on circuit board 40 to complete the electrical connection. Connector block 56, a female type connection in this embodiment, is secured to board 40 by the solder connection of leads 58 and tracts 46 of the circuit board 40. If desired, a like pin and notch connection used for connector block 50 can be used to mount connector block 56 to the circuit board. As shown in FIG. 2, circuit board 40 and connector block 50 and 56 are affixed between lower and upper frame parts 20 and 30. Frame parts 20 and 30 have complementary interfitting parts. Lower frame part 20 has a central opening 23 bordered by a recessed flange 24. Upper frame part 30 has central opening 33 bordered by a recessed flange 34. Circuit board 40 rests between upper and lower frame parts 20 and 30 between flanges 24 and 34. Central openings 23 and 33 provide space for circuitry and components of circuit board 40.

Upper and lower frame parts 20 and 30 are secured together about circuit board 40 by glue or other bonding materials. Alignment pins 39 of upper frame part 30 by being fitted into notches 29 of lower frame part 20 assist in the proper alignment of upper and lower frame parts 20 and 30. Frame openings 23 and 33 are enclosed by snap-fitting covers 60. Lower and upper frame parts 20 and 30 when connected from connector block openings 25 and 26 for accommodating connector blocks 50 and 56. Frame parts 30 and 20 have two fastener bores 28 on either side of connector opening 25, for accepting fastener screws of connecting plugs (not shown).

I claim:

1. A computer card for use in an electrical device with a CPU such as a computer comprising a circuit board having a circuit means for performing a variety of electrical functions and connector means for electrical connection between an external electrical source and said electrical device, a frame means for enclosing said circuit board including a pair of interlocked frame parts connectively engaging on opposite sides the perimeter edges of said circuit board, each frame part including a first opening for accommodating said circuit means.

2. The computer card of claim 1 wherein one of said frame parts includes a second opening for accommodating said connector means, said connector means received within said second opening.

3. The computer card of claim 2 wherein said card further includes a cover for enclosing said first opening of each frame part.

4. The computer card of claim 1 wherein said connector means includes a connector part conductively mounted to said circuit board.

5. The computer card of claim 4 wherein said connector part being one of a male type connector or female type connector.

6. The computer card of claim 4 wherein said connector means includes a second connector part conductively mounted to said circuit board.

7. A computer card for use in an electrical device with a CPU such as a computer comprising a circuit board having a circuit means for performing a variety of electrical functions and connector means for electrical connection between an external electrical source and said electrical device, a frame means for enclosing said circuit board including a pair of interlocked frame parts connectively engaging on opposite sides the perimeter edges of said circuit board, said circuit board having opposed notches, said connector part including pins, said connector part pins fitted into said circuit board notches to connect said connector part to said circuit board.

* * * * *